(12) United States Patent
Gragert et al.

(10) Patent No.: US 10,872,992 B2
(45) Date of Patent: Dec. 22, 2020

(54) POLYMER CONDUCTOR SHEETS, SOLAR CELLS AND METHODS FOR PRODUCING SAME

(71) Applicant: MEYER BURGER (SWITZERLAND) AG, Gwatt/Thun (CH)

(72) Inventors: Maria Gragert, Olten (CH); Thomas Soderstrom, Thun (CH); Rainer Grischke, Steffisburg (CH); Yu Yao, Thun (CH); Hengyu Li, Hauterive (CH)

(73) Assignee: MEYER BURGER (SWITZERLAND) AG, Gwatt/Thun (CH)

( * ) Notice: Subject to any disclaimer, the term of this patent is extended or adjusted under 35 U.S.C. 154(b) by 0 days.

(21) Appl. No.: 15/773,953

(22) PCT Filed: Oct. 27, 2016

(86) PCT No.: PCT/EP2016/075911
§ 371 (c)(1),
(2) Date: May 4, 2018

(87) PCT Pub. No.: WO2017/076735
PCT Pub. Date: May 11, 2017

(65) Prior Publication Data
US 2018/0315875 A1    Nov. 1, 2018

(30) Foreign Application Priority Data
Nov. 6, 2015   (EP) ..................... 15193339

(51) Int. Cl.
*H01L 31/05*    (2014.01)
*H01L 31/048*   (2014.01)
(Continued)

(52) U.S. Cl.
CPC ............. *H01L 31/0512* (2013.01); *B32B 3/08* (2013.01); *B32B 5/142* (2013.01); *B32B 5/147* (2013.01);
(Continued)

(58) Field of Classification Search
CPC . H01L 31/0512; H01L 31/0488; B32B 27/32; B32B 17/064; B32B 27/16
(Continued)

(56) References Cited

U.S. PATENT DOCUMENTS 6,586,271 B2 * 7/2003 Hanoka ............ B32B 17/10302
                                                136/244
7,432,438 B2   10/2008 Rubin et al.
(Continued)

FOREIGN PATENT DOCUMENTS

EP     2525395         11/2012
WO     WO 2004/021455   3/2004
(Continued)

OTHER PUBLICATIONS

International Search Report and Written Opinion for PCT/EP2016/075911, dated Feb. 7, 2017.

*Primary Examiner* — Tahseen Khan
(74) *Attorney, Agent, or Firm* — Bryan D. Zerhusen, Esq.; Nicholas R. Herrel, Esq.; Cantor Colburn LLP

(57) ABSTRACT

The present invention relates to polymer conductor sheets comprising zones featuring different degrees of polymerization and/or crosslinking within the same polymer sheet, wherein the zones differ, for example, in mechanical stability, ductility and/or (thermo)adhesiveness. The present invention also teaches devices comprising these zoned polymer conductor sheets such as solar cell strings, matrices and modules, uses thereof and methods for producing these.

16 Claims, 4 Drawing Sheets

(51) Int. Cl.

| | | |
|---|---|---|
| *B32B 27/16* | (2006.01) | |
| *B32B 27/32* | (2006.01) | |
| *B32B 17/06* | (2006.01) | |
| *B32B 27/28* | (2006.01) | |
| *B32B 27/30* | (2006.01) | |
| *B32B 27/42* | (2006.01) | |
| *B32B 25/04* | (2006.01) | |
| *B32B 3/08* | (2006.01) | |
| *B32B 27/08* | (2006.01) | |
| *B32B 27/20* | (2006.01) | |
| *B32B 17/00* | (2006.01) | |
| *B32B 27/36* | (2006.01) | |
| *B32B 25/14* | (2006.01) | |
| *B32B 27/40* | (2006.01) | |
| *B32B 7/08* | (2019.01) | |
| *B32B 27/34* | (2006.01) | |
| *B32B 27/06* | (2006.01) | |
| *B32B 5/14* | (2006.01) | |

(52) U.S. Cl.
CPC ............... *B32B 7/08* (2013.01); *B32B 17/00* (2013.01); *B32B 17/064* (2013.01); *B32B 25/04* (2013.01); *B32B 25/042* (2013.01); *B32B 25/14* (2013.01); *B32B 27/06* (2013.01); *B32B 27/08* (2013.01); *B32B 27/16* (2013.01); *B32B 27/20* (2013.01); *B32B 27/281* (2013.01); *B32B 27/283* (2013.01); *B32B 27/304* (2013.01); *B32B 27/306* (2013.01); *B32B 27/308* (2013.01); *B32B 27/32* (2013.01); *B32B 27/322* (2013.01); *B32B 27/34* (2013.01); *B32B 27/36* (2013.01); *B32B 27/40* (2013.01); *B32B 27/42* (2013.01); *H01L 31/048* (2013.01); *H01L 31/0488* (2013.01); *B32B 2255/10* (2013.01); *B32B 2255/205* (2013.01); *B32B 2270/00* (2013.01); *B32B 2307/202* (2013.01); *B32B 2307/412* (2013.01); *B32B 2457/12* (2013.01); *Y02E 10/50* (2013.01)

(58) Field of Classification Search
USPC ........................................................ 136/251
See application file for complete search history.

(56) References Cited

U.S. PATENT DOCUMENTS

| | | | | |
|---|---|---|---|---|
| 7,935,884 | B2 * | 5/2011 | Oi | H01L 31/048 136/251 |
| 8,383,929 | B2 * | 2/2013 | Milshtein | H01L 31/0392 136/251 |
| 8,697,981 | B2 * | 4/2014 | Adriani | H01L 31/02013 136/244 |
| 8,735,206 | B2 * | 5/2014 | Sumitomo | H01L 31/0504 438/67 |
| 8,796,542 | B2 * | 8/2014 | Huang | B32B 3/08 136/259 |
| 9,530,924 | B2 * | 12/2016 | Tabe | B32B 17/10788 |
| 2004/0209203 | A1 * | 10/2004 | Kano | G03F 7/0012 430/324 |
| 2007/0227584 | A1 * | 10/2007 | Tsunomura | H01L 31/048 136/251 |
| 2011/0045287 | A1 | 2/2011 | Kawashima et al. | |
| 2011/0121353 | A1 | 5/2011 | Sheats | |
| 2012/0006387 | A1 * | 1/2012 | Adachi | B32B 17/10788 136/251 |
| 2012/0294967 | A1 * | 11/2012 | Lin | H01L 21/67121 425/174.4 |
| 2012/0321844 | A1 | 12/2012 | Nakahama et al. | |
| 2012/0325518 | A1 * | 12/2012 | Nakao | C09J 7/29 174/133 R |
| 2013/0087199 | A1 * | 4/2013 | Naumovitz | B32B 17/10697 136/259 |
| 2013/0160825 | A1 * | 6/2013 | Lantzer | H01L 31/0201 136/251 |
| 2013/0206224 | A1 * | 8/2013 | Naumovitz | B32B 17/1055 136/256 |
| 2014/0000682 | A1 | 1/2014 | Zhao | |
| 2014/0008115 | A1 * | 1/2014 | Sato | H05K 1/02 174/258 |
| 2015/0050773 | A1 * | 2/2015 | Martini | H01L 31/0512 438/98 |
| 2015/0144180 | A1 | 5/2015 | Baccini et al. | |

FOREIGN PATENT DOCUMENTS

| | | |
|---|---|---|
| WO | WO 2011/089473 | 7/2011 |
| WO | WO 2013/182954 | 12/2013 |

\* cited by examiner

POLYMER CONDUCTOR SHEETS, SOLAR CELLS AND METHODS FOR PRODUCING SAME

CROSS-REFERENCE TO RELATED APPLICATIONS

This application is a U.S. National Stage entry of International Application No. PCT/EP2016/075911, titled, "Polymer Conductor Sheets, Solar Cells and Methods for Producing Same", as filed on Oct. 27, 2016, which claims the benefit of European Patent Application No. 15193339.7, filed on Nov. 6, 2015, which are both incorporated herein by reference in their entirety for all purposes.

The present invention relates to polymer conductor sheets comprising zones featuring different degrees of polymerization and/or crosslinking within the same polymer sheet, wherein the zones differ, for example, in mechanical stability, ductility and/or (thermo)adhesiveness. The present invention also teaches devices comprising these zoned polymer conductor sheets such as solar cell strings, matrices and modules, uses thereof and methods for producing these.

Electrically conducting connections within a solar cell or between solar cells in a solar cell array are usually achieved by soldering individual electrical conductors or grids of electrical conductors onto the current-generating element of solar cells. Current generating elements in the context of solar cells include p-n elements, organic current generating elements such as Grätzel cells. Polymeric materials are commonly used in the manufacture of solar cells to encapsulate and protect the solar cells against various external influences.

U.S. Pat. No. 6,586,271 B1 describes homogenously polymerized materials with high thermal creep resistance manufactured by irradiation-induced polymerization. Said polymers are used in various places in the solar cell and the polymers can be combined with a metal interconnection pattern placed on the backskin layer of the solar cell. This metal interconnection pattern is soldered or bonded to the solar cell by conductive epoxy after positioning the pattern onto the backskin material.

WO 2011/089473 describes a system and method for laminating solar cells with a membrane or an adhesive foil in order to press a plurality of layers of the solar cell together. WO 2004/021455 is directed to attaching conductive wires to an adhesive layer which in turn is attached to a separate, optically transparent and electrically insulating film. The adhesive layer and the insulating film are made of chemically different materials. The adhesive foil with the wires attached is then contacted with a surface of a p-n element.

It is the objective of the present invention to provide new and improved means for efficient and economic solar cell production.

This objective is solved by a polymer conductor sheet comprising (i) a polymer sheet comprising at least two adjacent zones within the same polymer sheet, which zones run in longitudinal direction of the polymer sheet, wherein
  (1) a first zone is sufficiently ductile and/or adhesive to fix the position of an elongated conductor on its surface facing the outside of the polymer sheet, and
  (2) a second zone adjacent to the first zone that has a different degree of polymerization and/or crosslinking than the first zone, and (ii) at least one elongated conductor positioned on the surface of the first zone facing the outside of the polymer sheet.

The polymer sheet comprising the at least two adjacent zones and for use according to the present invention is produced from one or more monomers. The polymer sheet for use in the present invention is a chemically homogenous material with regard to its original monomer composition. The differences in the degree of polymerization and/or the degree of crosslinking that distinguish the adjacent zones within the same polymer sheet are the result of positionally limited, i.e. zone-specific polymerization and/or crosslinking. In other words, the at least two adjacent zones are the result of different degrees of polymerization and/or crosslinking of the same starting materials. This starting material is also termed polymerizable sheet. For example, the different zones can be the result of zone-specific treatment of monomers or polymers that are (further) polymerized and/or (further) cross-linked, e.g. by zone-specific irradiation, zone-specific temperature control, and/or zone-specific chemical treatment. Contrary to an assembly of separate layers with different chemical compositions which were produced separately, the polymer sheet of the present invention is the result of the same homogenous starting materials in one sheet that is treated positionally different for polymerization and/or crosslinking. Because the zones form part of the same polymer sheet the zones are directly adjacent to and closely in contact with each other, forming a polymerized transition zone. The transition from one zone to the adjacent zone may be continuous, gradual or sharp in the sense that the degree of polymerization and/or crosslinking from one zone to the other zone can change abruptly or continuously within the polymer sheet. The zones of the polymer sheet for use in the present invention are not the result of a step-wise assembly of different and/or separate layers but are individual zones encompassed within the same polymer matrix sheet, which zones differ in their degree of polymerization and or crosslinking.

As generally understood, a polymer is the result of a reaction between identical or different monomers. The degree of polymerization is commonly known as the number of monomeric units in the polymer. Crosslinking refers to producing one or more bonds that link one polymer part to another polymer part, possibly parts of the same or different polymers, e.g. by covalent or ionic bonds.

Polymers with identical composition but different degrees of polymerization and/or crosslinking typically exhibit different physical and/or chemical properties. In general, increasing the degree of polymerization and/or crosslinking correlates with higher melting temperature and higher mechanical strength of the polymer.

The zones within the polymer conductor sheet run in the longitudinal direction of the polymer sheet, i.e. parallel to the flat sides of the sheet. Also, the zones of the polymer conductor sheet are located one above the other in the longitudinal direction. Preferably, the zones may be overlapping.

According to the invention, one zone can provide increased stability for the entire sheet due to its higher degree of polymerization and/or crosslinking compared to the less polymerized and/or crosslinked other zone(s). One zone can be more ductile, less rigid and possibly even adhesive or thermoadhesive compared to the other zone(s), thus allowing for e.g. laminating the polymer conductor sheet to a current generating element or to a glass surface. The first zone is suited for receiving, fixing and possibly even conforming to some extent to the shape of a current generating element(s) and/or a conductor(s) such as, e.g. a wire or a wire web.

A conductor is any means capable of conducting an electrical current. For example, it may be in the form of a wire, a bar, an electrode or an assembly of wires, e.g. a wire web, bars or electrodes. Typically, a conductor is a metallic structure which may not be self-supporting and which may be applied e.g. by electroplating or plasma spraying. The conductor may comprise an alloy on its surface which alloy may form a solder connection or form an eutectic system with the surface that is to be connected to the conductor, e.g. a current generating element for solar cell production. It may also be coated with a material for optical and/or aesthetic reasons.

Two or more polymer conductor sheets may be interconnected by their conductors, preferably by their conductor web. In other words, two or more polymer sheets may be positioned on the same conductor, preferably conductor web, at different sites of the conductor, thus forming polymer conductor sheets which are interconnected by the same conductor or conductor web.

The term current generating element for use according to the present invention is meant to encompass a p-n junction element, an organic current generating element or a dye-sensitized solar cell such as the Grätzel cell. Typically, a p-n junction element is the boundary element or interface between two types of semiconductor materials (p-type and n-type) inside a single crystal of a semiconductor which may form part of a solar cell. An organic current generating element is typically produced from conductive organic polymers or conductive small organic molecules. A dye-sensitized solar cell is based on a semiconductor formed between a photo-sensitized anode and an electrolyte forming a photoelectrochemical system.

The conductor positioned on the first zone of the polymer sheet can be stabilized in its position on the polymer sheet due to the ductile and/or (thermo)adhesive properties of the latter, thus allowing for spatial fixation of the conductor(s) on the polymer sheet during assembly, transport and/or final application of the polymer conductor sheet, e.g. to a current generating element for producing a solar cell.

The term adhesive as used herein means that the adhesive zone receives and positionally fixates the at least one conductor and encompasses the term thermoadhesive. Thermoadhesive means that the adhesive properties of a zone are a function of its temperature, e.g. the zone will be more adhesive when heated. Receiving and fixating the at least one conductor can be the result of adhesive forces and/or of the ductile properties and/or adaption of the zone to the shape of the at least one conductor, thus preventing lateral movement on the sheet and/or separation of the conductor from the first zone. The term adhesive is not limited to a sticky surface but preferably characterizes any adhering of the conductor(s) to the first zone. Ductile as used herein means that the zone can adjust three-dimensionally to the shape of the at least one conductor.

The first zone of the polymer sheet may only embed part of the conductor(s) so that a protruding part of the conductor can still contact the device of interest, e.g. a current generating element for producing a solar cell.

In a preferred embodiment, the polymer conductor sheet of the present invention further comprises a third zone within the same polymer sheet that has a different degree of polymerization and/or crosslinking than the second zone, wherein the third zone is located adjacent to the second zone.

In a further preferred embodiment, the third zone of the polymer sheet of the present invention has a lower degree of polymerization and/or crosslinking than the second zone, preferably also lower than the first zone.

For example, a polymer conductor sheet of the present invention may be of the following structure comprising three zones: A first zone receiving the at least one conductor which is less polymerized and/or crosslinked compared to the adjacent second zone. The more polymerized second zone provides stability for the polymer conductor sheet due to its higher degree of polymerization and/or crosslinking compared to the first zone. A third zone is located adjacent to the second zone, which third zone is less polymerized and/or crosslinked compared to the first and second zone. The low degree of polymerization of the third zone facilitates the adhesion of the polymer conductor sheet via its third zone to an exterior surface, e.g. a glass plate. For illustration of possible zone embodiments of the present invention, reference is also made to FIGS. 1 to 8 below.

The polymer conductor sheet of the present invention is preferably 20 to 400 µm, more preferably 40 to 300 µm, most preferably 60 to 200 µm thick. The thickness of each zone of the polymer conductor sheet can vary individually and is preferably 20 to 80%, more preferably 20 to 60%, most preferably 30 to 50% of the total thickness of the polymer conductor sheet. It is also preferred that the thickness of the first zone is 30 to 80% of the thickness or diameter of the at least one conductor, more preferably 40 to 60% of the thickness of the at least one conductor.

The relative difference in the degree of polymerization and/or crosslinking of the first zone and the second zone preferably is at least 5, 10 or 20%, preferably at least 40 or 50%.

Preferably at least one zone of the polymer conductor sheet is cured to at least 5%, more preferably to at least 15% and most preferably to at least 25%. The degree of polymerization is measured according to DIN EN 579:1993-09 replaced by ISO 10147:2011 or EN ISO 10147:2012.

It is preferred that the polymerization and/or crosslinking of at least one zone is not constant throughout the zone, especially in a direction perpendicular to the flat sides of the sheet.

Polymerization and/or crosslinking of one zone within the same sheet can be realized by irradiation from one or both sides of the sheet, with the same or different irradiation type(s) or same or different irradiation intensities, thus leading to a changing zone course, possibly due to partial and/or overlapping irradiation. For example, a polymer sheet irradiated from both sides can possibly produce an overlap pattern in the center of the sheet, i.e. the overlap region forming a polymerized and/or crosslinked zone. Irradiation intensity can be a function of the penetration depth of the irradiation depending on the absorption capacity of the polymer sheet material. In other words, irradiation energy can be absorbed with penetration depth leading to a gradually changing degree of polymerization and/or crosslinking. For example, the degree of polymerization/crosslinking of the polymer conductor sheet can be higher on the sheet's side which faces the irradiation source.

The zone(s) of the polymer conductor sheet can preferably be irregular or structured due to partial masking of the polymer sheet during irradiation. For example, if the conductors are applied to the first receiving zone prior to irradiation, the conductors can partially mask or reflect the irradiation leading to less polymerization in the masked areas and more polymerization and/or crosslinking in the adjacent unmasked areas. This partially masked zone could, for example, be more ductile and/or adhesive at the masked conductor contact sites and more stable, i.e. more polymerized and/or more crosslinked in the adjacent regions, thus favoring the fixation of the conductors and at the same time the stability of the sheet. Also, a higher degree of polymerization of a zone or portions thereof, e.g. portions not masked by conductors during irradiation, may improve the light transmittance of the sheet, preferably for wavelengths used by the current generating element.

In a further preferred embodiment the first zone of the polymer conductor sheet of the present invention has a lower degree of polymerization and/or crosslinking than the second zone and the third zone of same polymer sheet has a lower degree of polymerization and/or crosslinking than the first zone.

In yet another preferred embodiment, the difference in the degree of polymerization and/or crosslinking in the first, second and/or third zone of the polymer conductor sheet of the present invention is the result of one or more of the following:
1. zone-specific irradiation, preferably electron, ion, atomic, heat or electro-magnetic irradiation,
2. zone-specific temperature treatment,
3. zone-specific chemical treatment
within the same polymer sheet.

Zone-specific treatment can take place before, during or after positioning the at least one conductor on the sheet. The zone-specific treatment can induce, promote or inhibit polymerization and/or crosslinking in the polymeric materials in a controlled manner and the treated materials preferably remain suitable for being laminated to other surfaces. The amount, intensity and/or profile of irradiation energy applied, the temperature and/or temperature profile, the concentration of polymerization/crosslinking-inducing, -promoting or -inhibiting chemicals and/or the duration of the treatment lead to controlled degrees of polymerization and/or crosslinking. The person skilled in the art will understand that different materials will require different treatment energies, different treatment means/concentrations and/or different treatment profiles.

Zone-specific irradiation is preferably performed with a high-energy electron beam. The radiation dosage may be in the range of 40 to 200 kV, preferably 80 to 120 kV or 10 to 200 kGy depending on the material of the polymeric conductor sheet and depending on the desired degree of polymerization and/or crosslinking.

Also, it is preferred to zone-specifically irradiate with heat. Typically the temperatures applied for heat irradiation are between 20 and 175° C. depending on the material of the polymeric conductor sheet and depending on the desired degree of polymerization and/or crosslinking.

Ion irradiation can be realized e.g. by generating a plasma.

Furthermore, it is preferred to zone-specifically irradiate with electro-magnetic energy, preferably with light irradiation ranging from IR to UV-light.

Modifying the properties of polymers by atomic radiation is common general knowledge and has been published, e.g. in the textbook "Atomic Radiation and Polymers", A Charlesby, Pergamon Press, N Y, 1960.

Zone-specific temperature treatment preferably includes the zone-specific application of heat or cold to induce, promote or inhibit polymerization and/or crosslinking.

Also, zone-specific chemical treatment can be used for influencing the degree of polymerization and/or crosslinking. Chemical treatment preferably includes the application of known chemical polymerization and crosslinking inducers, enhancers or inhibitors such as radicals or radical sources (e.g. AIBN, ABCN), peroxides or oxidizing agents (e.g. tert-butylperoxy-2-ethylhexyl carbonate (TBPEHC or TBEC), benzoyl peroxide, hydrogen peroxide, di-tertbutylperoxide, methyl ethyl ketone peroxide, acetone peroxide, peroxydisulfate salts), strong nucleophilic bases (e.g. butyllithium, $KNH_2$), protonic acids (e.g. phosphoric-, sulfuric-, fluoroand triflic acid), Lewis-Acids (e.g. $SnCl_4$, $AlCl_3$, $BF_3$, $TiCl_4$), metal catalysts (e.g. Ziegler-Natta catalyst, zirconocenes, Phillipps catalyst, nickel or palladium complexes with nitrogen), radicalquenchers (e.g. hydroquinones, monomethylethers of hydroquinones), TAIC (triallyl isocyanate).

In a further preferred embodiment, the first and/or third zone of the polymer conductor sheet of the present invention is/are adhesive, preferably thermoadhesive at temperatures preferably above 50° C., more preferably above 65° C., most preferably above 89° C., preferably the first zone is ductile, preferably deformable, and the third zone is adhesive.

The polymer conductor sheet of the present invention can preferably be at least partially transparent.

Partially transparent means that light is at least partially transmitted through the sheet. Preferably, an at least partially transparent sheet is fully transparent preferably having a transmittance of more than 80% in most of the frequency range relevant for solar cells or semitransparent.

The at least one elongated conductor of the polymer conductor sheet of the present invention is preferably selected from the group consisting of a wire, strip, ribbon, preferably having a mesh-, web- or grid-like structure.

In a yet another preferred embodiment, the polymer of the polymer conductor sheet of the present invention is selected from the group consisting of thermoplasts, duroplasts, elastomers, and thermoplastic elastomers, preferably polyolefins, polyesters, polyamides, polyimides, polyacrylates, ionomers, polyvinylbutyral (PVB), silicones and polyurethanes (PU), more preferably thermoplastic polyolefins (TPO), polyolefinic elastomers (POE), thermoplastic polyurethanes (TPU), ethylene vinyl acetates (EVAs), polyethylenetetrafluoroethylene (ETFE), polyvinyl chlorides (PVCs), ionomers, polyethylene methacrylic acid (EMA) and polyethylene acrylic acid (EAA), polyethylene terephthalate (PET) and nylon, poly methyl methacrylate (PMMA), polymethacrylate (PMA), polyvinylsilanes or any combination thereof.

The polymer conductor sheet may consist of a large variety of polymeric materials as well as of their common derivatives. For example, such materials can be copolymers of ethylene or copolymers of vinyl acetate and ethylene.

Also, the polymer sheet materials may be ionomers. Ionomers can be derived from any direct or grafted ethylene copolymer of an alpha olefin having the formula R—CH═$CH_2$, where R is a radical selected from the group consisting of hydrogen and aryl radicals preferably featuring from 1 to 8 carbon atoms and alpha, beta-ethylenically unsaturated carboxylic acid preferably featuring from 3 to 8 carbon atoms or longer. The acid moieties are randomly or non-randomly distributed in the polymer chain. The alpha olefin content of the copolymer preferably ranges from 50-92% while the unsaturated carboxylic acid content of the copolymer preferably ranges from about 2 to 25 mol-%, based on the alpha olefin-acid copolymer; and said acid copolymers preferably feature 10 to 90% of the carboxylic acid groups ionized by neutralization with metal ions from any of the group I, II or III type metals. In a more preferred embodiment, the ionomer may be a sodium ionomer comprising methacrylic acid or a Zn and Na ionomer. Also, the polymer may comprise metallocene polyethylene comprising a copolymer (or comonomer) of ethylene and hexene, octene and butene and higher alpha-olefins. In a preferred embodiment, the metallocene polyethylene is ethylene alpha-olefin comprising comonomer of octene. Also, the polymer may be a co-extrusion of Ionomer-Metallocene-polyethylene-Ionomer (IMI).

Furthermore, the polymer may preferably comprise a polyolefin, more preferably a polyethylene or polypropylene with or without mineral fillers.

In a second aspect, the present invention is directed to a device comprising the polymer conductor sheet of the present invention.

In a preferred embodiment, the device of the present invention is a tabbed solar cell, a solar cell string, matrix or module. A tabbed solar cell in the context of the present invention is a polymer conductor sheet conductively connected to a single current generating element, wherein the conductors of the polymer conductor sheet can be connected to further current generating elements.

A solar cell string according to the invention is a two-dimensional arrangement of at least two solar cells which are conductively interconnected by a polymer conductor sheet. A solar cell matrix means a three-dimensional arrangement of solar cells which are conductively interconnected by a polymer conductor sheet. A solar cell module refers to solar cell string(s) or matrix(ces) which are laminated together and may comprise further elements such as e.g. glass plates.

In another preferred embodiment, a solar cell module of the present invention is (I) a solar cell module having a top and bottom side comprising:
  (a) at least two current generating elements,
  (b) at least two polymer conductor sheets,
  (c) optionally at least two encapsulant layers, and
  (d) at least two glass plates,
   wherein
  (i) at least two current generating elements (a) are conductively interconnected by the conductors of the at least two polymer conductor sheets (b) to form a solar cell string, and
  (iia) the glass plates (d) are connected to the polymer conductor sheets (b) on the top and bottom sides of the solar module, which glass plates form the outer surface of the solar cell module, or
  (iib) the optional encapsulant layers (c) connect the glass plates (d) to the polymer conductor sheets (b) on the top and/or bottom side of the solar module, which glass plates form the outer surface of the solar module;
   or (II) a solar cell module having a light source-facing and a light source-averted side comprising:
  (a) at least two current generating elements,
  (b) at least two polymer conductor sheets,
  (b2) optionally at least two encapsulant layers,
  (c) a back sheet, preferably an opaque back sheet, and
  (d) a glass plate,
   wherein
  (i) at least two current generating elements (a) are conductively interconnected by the conductors of the at least two polymer conductor sheets (b),
  (ii) the back sheet (c) is connected to the polymer conductor sheet (b) on the light source-averted side of the solar module,
  (iii) the glass plate (d) is connected to the polymer conductor sheet (b) on the light source-facing side of the solar module, and
  (iv) the optional encapsulant layers (b2) connect the glass plate (d) and/or the back sheet (c) to the polymer conductor sheets (b) on the top and bottom side of the solar module, respectively, which glass plate and back sheet form the outer surface of the solar module;
   or (III) a solar cell module according to (I) or (II) above, further comprising at least one encapsulant layer consisting of a polymer sheet comprising at least two adjacent zones within the same polymer sheet, which zones run in longitudinal direction of the polymer sheet, wherein
  (i) a first zone of the encapsulant layer is sufficiently ductile and/or adhesive to adhere to an outer layer of the solar module with its surface facing outside of the polymer sheet, and
  (ii) a second zone adjacent to the first zone of the encapsulant layer that has a different degree of polymerization and/or crosslinking than the first zone.

It is preferred that above elements (a) to (d) are connected by lamination. It is further preferred that at least one of the following elements, a zone of the polymer conductor sheet, an encapsulant layer or a back sheet is sufficiently ductile to fill any cavities resulting between the current generating elements (a) and the conductors of the polymer conductor sheets during lamination.

FIGS. 7 and 8 illustrate specific embodiments of the above solar cell modules (I) and (II). The light source-facing side of a solar cell module is the side of the module which receives the light, e.g. sun light, for generating an electrical current. The light source-averted side of a solar cell module is the side of the module which is facing away from the light source, e.g. the sun. The light source is any source which is capable of emitting an energy which a current generating element can transform into an electrical current.

The solar cell string, matrix or module comprising current generating elements are preferably interconnected by one or more polymer conductor sheet(s) of the present invention.

In a third aspect, the present invention is directed to a use of a polymer conductor sheet of the present invention for interconnecting current generating elements in a solar cell string, matrix or module.

In a fourth aspect, the present invention is directed to a method for producing a tabbed solar cell, a solar cell string, matrix or module, comprising the steps of:
(i) providing a polymer conductor sheet according to the invention, and
(ii) aligning and contacting the polymer conductor sheet of step (i) to at least one current generating element, and
(iii) conductively connecting the polymer conductor sheet to the at least one current generating element, optionally under pressure and/or heat.

The conductive connection between the conductor component of the polymer conductor sheet and the current generating element is preferably accomplished by attaching, e.g. laminating the first zone of the polymer conductor sheet to the current generating element, preferably while applying heat and/or pressure, preferably under vacuum. During the lamination procedure the first zone holds the conductor(s) in place and its preferably elastomeric and/or adhesive and/or thermoadhesive properties preferably also aid the lamination process. However, conductively connecting the polymer conductor sheet in step (ii) of the above-described method of the invention can also be accomplished without mechanically connecting the at least one conductor with the current generating element, as long as the conduction of electrical current from the current generating element to the conductor is achieved. In a preferred embodiment, the first zone of the polymer conductor sheet can fill the cavities between the at least one conductor and the current generating element during lamination.

It is preferred that the polymer conductor sheet of the present invention is pre-fabricated with continuous conductor elements (e.g. continuous wires) and sheets, and preferably stored in the form of a roll. Prior to lamination the roll is uncoiled and preferably cut to size as to agree with the solar cells to be interconnected. One, two or many current generating elements are positioned appropriately onto the polymer conductor sheet and the polymer conductor sheet is attached to produce the solar cell(s).

In a preferred embodiment, at least one polymer conductor sheet of the present invention is aligned, contacted and connected to each side of at least one current generating element in the method according to the present invention.

In a further preferred embodiment, at least one polymer conductor sheet of the present invention is aligned, contacted and connected to at least one side of at least two current generating elements, thus mechanically and electrically interconnecting said elements according to the method of the present invention.

The conductor elements may be conductively connected to the current generating element(s) prior to further lamination, e.g. by induction or laser soldering, or during lamination of a solar module.

The polymer conductor sheet(s) is/are preferably connected to the current generating element in a laminator.

In a fifth aspect, the present invention is directed to a method for forming a polymer conductor sheet according to the invention, comprising the steps of:
a) providing a polymerizable sheet that can be at least partially polymerized and/or crosslinked;
b) polymerizing and/or crosslinking the polymerizable sheet zone-specifically to generate a first, second and/or third zone within the same polymer sheet by one or more treatments selected from the group consisting of:
   zone-specific irradiation, preferably electron, ion, atomic, neutron, heat or electro-magnetic irradiation,
   zone-specific temperature treatment, and
   zone-specific chemical treatment
   within the same polymer sheet;
c) providing an elongated conductor; and
d) positioning, preferably temporarily attaching, the elongated conductor on the surface of the first zone facing the outside of the polymer sheet.

Step d) may be carried out after step b) or prior to it.

In the following the present invention will be further illustrated by way of figures, which represent specific and non-limiting embodiments of the invention, none of which are to be considered as limiting the invention beyond the scope of the appended claims. In the Figures, identical, functionally identical or similar parts are shown with the same reference number.

FIGURES

Figure 4:
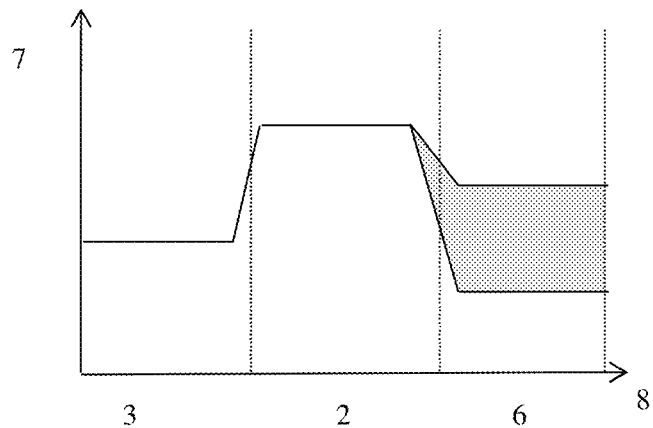
Figure 5:
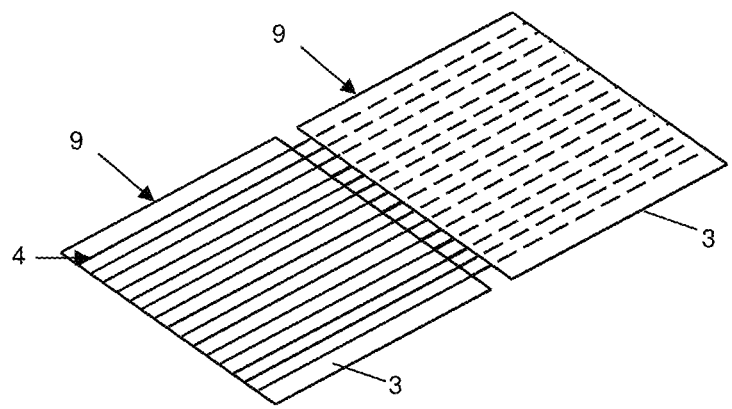
Figure 6:
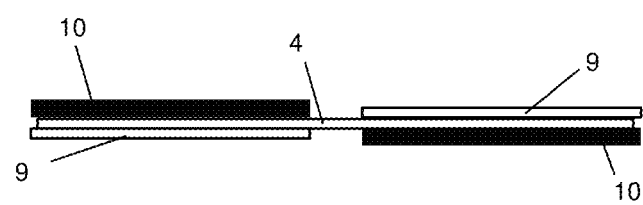
Figure 7:
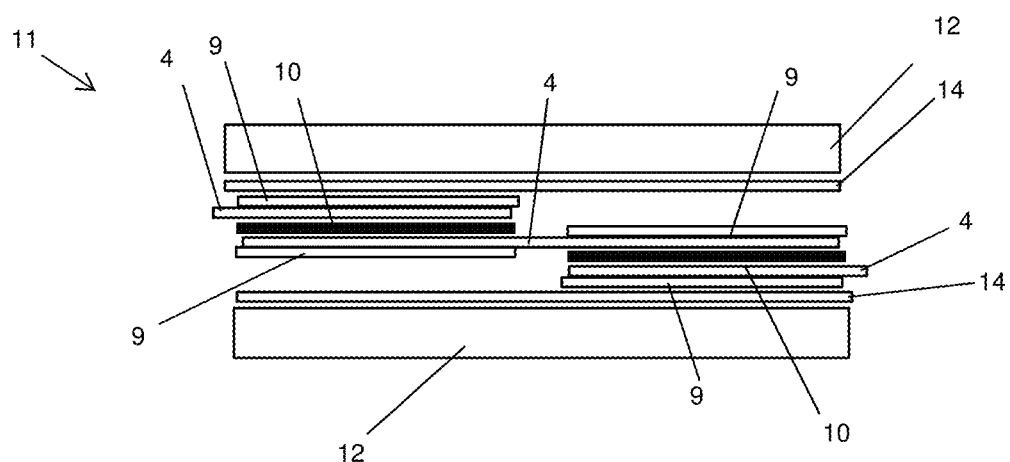
Figure 8:
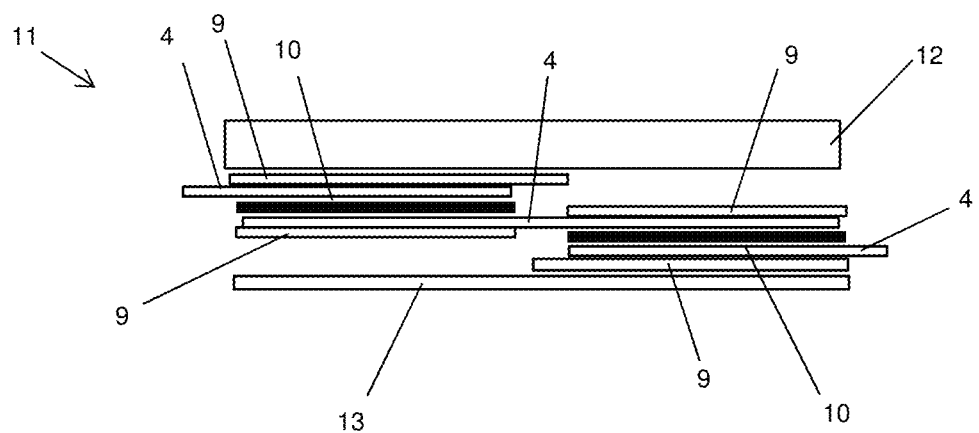
Figure 9:
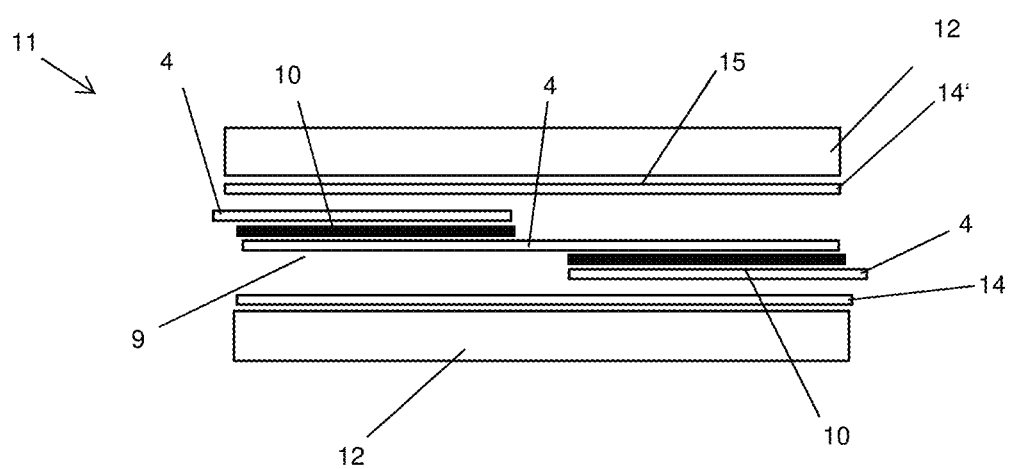

FIG. 4 is a diagram showing the degree of polymerization and/or crosslinking as a function of zones FIG. 5 shows two polymer conductor sheets with connectors FIG. 6 shows two solar cells interconnected by the conductors of two polymer conductor sheets FIG. 7 shows a lay-up for a solar module with an encapsulant layer FIG. 8 shows a lay-up for a solar module without encapsulant layer FIG. 9 shows a lay-up for a solar cell module comprising two glass plates

TABLE OF REFERENCES

Figure 1:
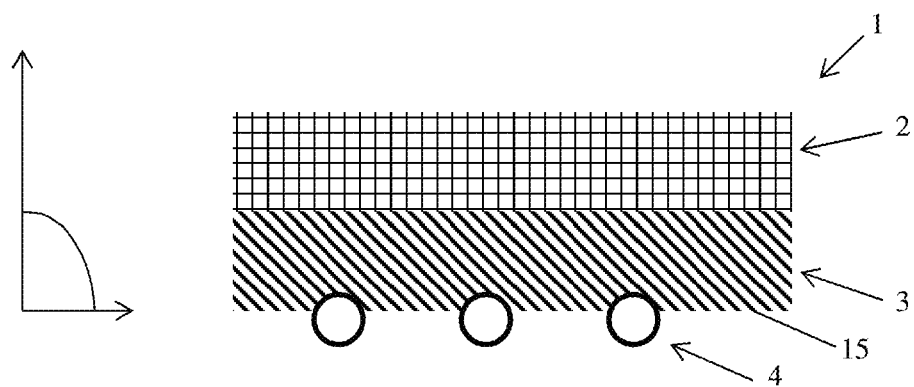
FIG. 1 shows a polymer conductor sheet with two zones and conductors

1 polymer conductor sheet with 2 zones
2 second zone
3 first zone
4 conductor(s)
5 polymer conductor sheet with 3 zones
6 third zone
7 y-axis (degree of polymerization and/or crosslinking)
8 x-axis
9 polymer conductor sheet
10 current generating element
11 lay-up for a solar module
12 glass plate
13 back sheet
14 encapsulant layer
15 flat side of the sheet FIG. 1 shows a side view of a polymer sheet (1) comprising two adjacent zones (2) and (3) within the same polymer sheet (1), the first zone (3) extending between the second zone (2) and the flat side 15 of the sheet. The second zone (2) has a higher degree of polymerization and/or crosslinking and has a higher stability due to polymerizing and/or crosslinking than the first zone (3), and the first zone (3) is more ductile and/or adhesive and has a lower degree of polymerization and/or crosslinking than the second zone (2) due to no or less polymerizing and/or crosslinking than the second zone (2). Elongated conductors (4) (extending in the direction perpendicular to the plane of the figure) are positioned on and held by the less polymerized and/or crosslinked first zone (3). To the left of FIGS. 1 to 3 the degree of polymerization and/or crosslinking is depicted as function of the location in the polymer sheet (1).

Figure 2:
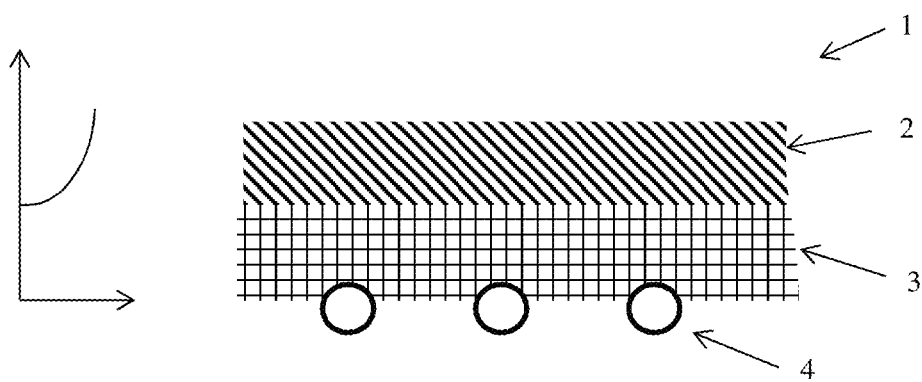
FIG. 2 shows a polymer conductor sheet with two zones and conductors

FIG. 2 shows a side view of a polymer sheet (1) comprising two adjacent zones (2) and (3) within the same polymer sheet (1). The first zone (3) has a higher degree of polymerization and/or crosslinking and has a higher stability due to polymerizing and/or crosslinking than the second zone (2), and the second zone (2) is more ductile and/or adhesive and has a lower degree of polymerization and/or crosslinking than the first zone (3) due to no or less polymerizing and/or crosslinking than the first zone (3). Elongated conductors (4) (extending in the direction perpendicular to the plane of the figure) are positioned on and held by the more polymerized and/or crosslinked first zone (3).

Figure 3:
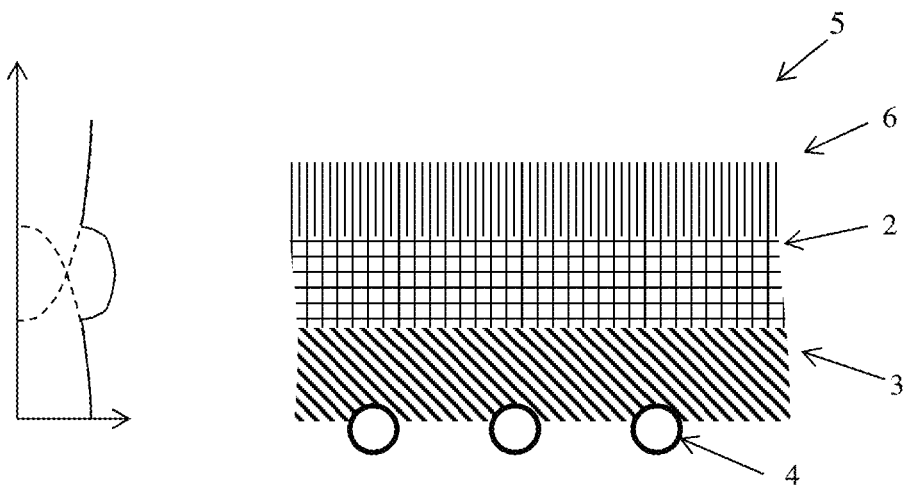
FIG. 3 shows a polymer conductor sheet with three zones and conductors

FIG. 3 shows a side view of a polymer sheet (5) comprising three adjacent zones (2), (3) and (6) within the same polymer sheet (5). The second zone (2) has a higher degree of polymerization and/or crosslinking and has a higher stability due to polymerizing and/or crosslinking than the first zone (3), the first zone (3) is more ductile and/or adhesive and has a lower degree of polymerization and/or crosslinking than the second zone (2) due to no or less polymerizing and/or crosslinking than the second zone (2). Elongated conductors (4) are positioned on the less polymerized and/or crosslinked first zone (3). The third zone (6) located adjacent to the second zone (2) is more ductile and/or adhesive and has a lower degree of polymerization and/or crosslinking than the second zone (2) due to no or less polymerizing and/or crosslinking than the second zone (2) and has a lower degree of polymerization and/or crosslinking than the first zone (3).

FIG. 4 is a diagram (comparable to those to the left in FIGS. 1 to 3) showing the degree of polymerization and/or crosslinking on the y-axis (7) as a function of a first, second and third zone (3, 2 and 6) of a polymer conductor sheet (1) on the x-axis (8).

FIG. 5 shows two polymer conductor sheet (9) interconnected by elongated conductors (4). The sheets are positioned such that the first zone (3) of the left polymer sheet (9) is facing up thus rendering the conductors (4) visible and the first zone (3) of the right sheet (9) is facing down covering the conductors.

FIG. 6 shows two current generating elements (10) interconnected by the conductors (4) of two polymer conductor sheets (9).

FIG. 7 shows a lay-up for a solar module (11) comprising two current generating elements (10) interconnected by the elongated conductors (4) of two polymer conductor sheets (9). The elongated conductors (4) of the respective polymer conductor sheets (9) extend out of the solar module (11). Encapsulant layers (14) mechanically connect two glass plates (12) to the polymer conductor sheets (9), which glass plates (12) form the outer hull of the solar module after lamination.

FIG. 8 shows a lay-up without encapsulant layers. Here, the polymer conductor sheets (9) are large enough to fill cavities between the current generating elements (10), conductors (4) and the glass plate (12)/back sheet (13). The side of the solar module not facing the sun is covered by a back sheet (13) which can be opaque.

FIG. 9 shows a lay-up for a solar module (11) comprising two current generating elements (10) interconnected by the elongated conductors (4). The elongated conductors (4) extend out of the solar module (11). Encapsulant layers (14) mechanically connect two glass plates (12) to the two current generating elements (10) interconnected by the elongated conductors (4), which glass plates (12) form the outer hull of the solar module after lamination. The encapsulant layers (14) each consist of a polymer sheet (14') comprising at least two adjacent zones, the first zone forming the upper face (15) and being sufficiently ductile and/or adhesive to adhere to the upper glass plate (12) forming the outer layer of the module and the second zone, adjacent to the first zone, has a different degree of polymerization and/or crosslinking than the first zone Examples A non-limiting example for the production of a polymer conductor sheet and a solar cell module according to the present invention is provided.

A PV-FS CVF sheet (dnpSolar, Karlslunde, Denmark) of 400 μm thickness was irradiated with 200 kV acceleration voltage using an EBlab e-beam device (ebeam Technologies, COMET AG, Flamatt, Switzerland). This irradiation step polymerized and/or crosslinked the first zone of the polymer sheet facing the irradiation source with a complex viscosity of about $4\times10^4$ Pas at 85° C., the rest of the sheet forming the second zone with less polymerization and/or crosslinking.

Subsequently, a grid of conductors was placed on the first zone of the polymer sheet, thus yielding a polymer conductor sheet. By heating the conductors, the first zone was locally melted thus rendering it adhesive enough to hold the conductors.

Current generating elements were laminated for 20 minutes at a maximum temperature of 170° C. with the above polymer conductor sheets, two layers of PV-FS CVF sheet (dnpSolar, Karlslunde, Denmark) of 400 μm thickness on opposite sides and two 3.2 mm thick glass plates on opposite sides (solar grade glass, flsolar GmbH, Suelzetal, Germany) yielding a solar cell module with the build-up as shown in FIG. 7.

The invention claimed is:

1. A polymer conductor sheet comprising
   (i) a polymer sheet comprising at least two adjacent zones within the same polymer sheet, which zones run in longitudinal direction of the polymer sheet, wherein
      (1) a first zone is sufficiently ductile and/or adhesive to fix the position of an elongated conductor on its surface facing the outside of the polymer sheet, and
      (2) a second zone adjacent to the first zone that has a different degree of polymerization and/or crosslinking than the first zone; and
   (ii) at least one elongated conductor positioned on the surface of the first zone facing the outside of the polymer sheet.

2. The polymer conductor sheet of claim 1, wherein the difference in the degree of polymerization and/or crosslinking in the first, second and/or third zone is the result of one or more of the following:
   1. zone-specific irradiation, preferably electron, ion, atomic, neutron, heat or electro-magnetic irradiation,
   2. zone-specific temperature treatment,
   3. zone-specific chemical treatment within the same polymer sheet.

3. The polymer conductor sheet of claim 1, wherein the polymer is selected from the group consisting of thermoplasts, duroplasts, elastomers, and thermoplastic elastomers, preferably polyolefins, polyesters, polyamides, polyimides, polyacrylates, ionomers, polyvinylbutyral (PVB), silicones and polyurethanes (PU), more preferably thermoplastic polyolefins (TPO), polyolefinic elastomers (POE), thermoplastic polyurethanes (TPU), ethylene vinyl acetates (EVAs), polyethylenetetrafluoroethylene (ETFE), polyvinyl chlorides (PVCs), ionomers, polyethylene methacrylic acid (EMA) and polyethylene acrylic acid (EAA), polyethylene terephthalate (PET) and nylon, poly methyl methacrylate (PMMA), polymethacrylate (PMA), polyvinylsilanes or any combination thereof.

4. The polymer conductor sheet of claim 1, further comprising a third zone within the same polymer sheet that has a different degree of polymerization and/or crosslinking than the second zone, wherein the third zone is located adjacent to the second zone.

5. The polymer conductor sheet of claim 4, wherein the first zone within the same polymer sheet has a lower degree of polymerization and/or crosslinking than the second zone and the third zone within the same polymer sheet has a lower degree of polymerization and/or crosslinking than the first zone.

6. The polymer conductor sheet of claim 4, wherein the third zone within the same polymer sheet has a lower degree of polymerization and/or crosslinking than the second zone.

7. The polymer conductor sheet of claim 6, wherein the third zone within the same polymer sheet has a lower degree of polymerization and/or crosslinking than the second zone and the first zone.

8. The polymer conductor sheet of claim 4, wherein the first and/or third zone is/are thermoadhesive.

9. The polymer conductor sheet of claim 8, wherein the first zone is ductile and the third zone is thermoadhesive.

10. A device comprising a polymer conductor sheet of claim 1.

11. The device according to claim 10, wherein the device is a tabbed solar cell, a solar cell string, matrix or module comprising current generating elements interconnected by a polymer conductor sheet of claim 1.

12. The device according to claim 11, wherein the solar cell module is
(I) a solar cell module having a top and bottom side comprising:
   (a) at least two current generating elements,
   (b) at least two polymer conductor sheets,
   (c) optionally at least two encapsulant layers, and
   (d) at least two glass plates,
   wherein
   (i) at least two current generating elements (a) are conductively interconnected by the conductors of the at least two polymer conductor sheets (b) to form a solar cell string, and
   (iia) the glass plates (d) are connected to the polymer conductor sheets (b) on the top and bottom sides of the solar module, which glass plates form the outer surface of the solar cell module, or
   (iib) the optional encapsulant layers (c) connect the glass plates (d) to the polymer conductor sheets (b) on the top and/or bottom side of the solar module, which glass plates form the outer surface of the solar module;
or
(II) a solar cell module having a light source-facing and a light source-averted side comprising:
   (a) at least two current generating elements,
   (b) at least two polymer conductor sheets,
   (b2) optionally at least two encapsulant layers,
   (c) a back sheet, preferably an opaque back sheet, and
   (d) a glass plate,
   wherein
   (i) at least two current generating elements (a) are conductively interconnected by the conductors of the at least two polymer conductor sheets (b),
   (ii) the back sheet (c) is connected to the polymer conductor sheet (b) on the light source-averted side of the solar module,
   (iii) the glass plate (d) is connected to the polymer conductor sheet (b) on the light source-facing side of the solar module, and
   (iv) the optional encapsulant layers (b2) connect the glass plate (d) and/or the back sheet (c) to the polymer conductor sheets (b) on the top and bottom side of the solar module, respectively, which glass plate and back sheet form the outer surface of the solar module;
or
(III) a solar cell module according to (I) or (II) above, further comprising at least one encapsulant layer consisting of a polymer sheet comprising at least two adjacent zones within the same polymer sheet, which zones run in longitudinal direction of the polymer sheet, wherein
   (i) a first zone of the encapsulant layer is sufficiently ductile and/or adhesive to adhere to an outer layer of the solar module with its surface facing outside of the polymer sheet, and
   (ii) a second zone adjacent to the first zone of the encapsulant layer that has a different degree of polymerization and/or crosslinking than the first zone.

13. A method for producing a tabbed solar cell, a solar cell string, matrix or module, comprising the steps of:
   (i) providing a polymer conductor sheet of claim 1, and
   (ii) aligning and contacting the polymer conductor sheet of step (i) to at least one current generating element, and
   (iii) conductively connecting the polymer conductor sheet to the at least one current generating element, optionally under pressure and/or heat.

14. The method according to claim 13, wherein at least one polymer conductor sheet of claim 1 is aligned, contacted and connected to each side of at least one current generating element.

15. The method according to claim 13, wherein at least one polymer conductor sheet of claim 1 is aligned, contacted and connected to at least one side of at least two current generating element, thus mechanically and electrically interconnecting said elements.

16. A method for forming a polymer conductor sheet according to claim 1, comprising the steps of:
   a) providing a polymerizable and/or crosslinkable sheet that can be at least partially polymerized and/or crosslinked;
   b) polymerizing and/or crosslinking the polymerizable and/or crosslinkable sheet zone-specifically to generate a first, second and/or third zone within the same polymer sheet by one or more treatments selected from the group consisting of:
      zone-specific irradiation, preferably electron, ion, atomic, neutron, heat or electro-magnetic irradiation,
      zone-specific temperature treatment, and
      zone-specific chemical treatment within the same polymer sheet;
   c) providing an elongated conductor; and
   d) positioning, preferably temporarily attaching, the elongated conductor on the surface of the first zone facing the outside of the polymer sheet.

* * * * *